(12) United States Patent
Cheng et al.

(10) Patent No.: US 7,771,224 B2
(45) Date of Patent: Aug. 10, 2010

(54) ELECTRICAL CONNECTOR

(75) Inventors: Chih-Pi Cheng, Tu-Cheng (TW); Liang-Kai Lee, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/464,117

(22) Filed: May 12, 2009

(65) Prior Publication Data

US 2009/0280656 A1    Nov. 12, 2009

(30) Foreign Application Priority Data

May 12, 2008    (TW)    ............................... 97208164 U

(51) Int. Cl.
 *H01R 13/625*    (2006.01)
(52) U.S. Cl. .................................................... 439/342
(58) Field of Classification Search ................. 439/342, 439/259
 See application file for complete search history.

(56) References Cited

U.S. PATENT DOCUMENTS

| | | | |
|---|---|---|---|
| 6,017,234 A * | 1/2000 | Walkup et al. | 439/266 |
| 6,338,640 B1 * | 1/2002 | Lin | 439/342 |
| 6,669,500 B1 * | 12/2003 | Ju | 439/342 |
| 6,814,603 B2 * | 11/2004 | Okita et al. | 439/342 |
| 6,910,908 B2 * | 6/2005 | Tran et al. | 439/342 |
| 7,056,140 B1 * | 6/2006 | Jiang | 439/342 |
| 7,070,437 B1 * | 7/2006 | Huang | 439/342 |

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

An electrical connector (1) comprises a base (10) with a plurality of contacts (19) received therein, a cover (12) slidably mounted on the base (10), a protecting mechanism (14) comprises a cover plate (141) retained in the cover (12) and a bottom plate (142) retained in the base (10), a cam actuator (16) rotatably assembled to the base (10), the cover (12) and the protecting mechanism (14) for actuating the cover (12) to slid on the base (10), the base (10) comprises one or more block members (1011) extending upwardly, the bottom plate (142) defines a second through hole (1421), when assembled, the block member (1011) is positioned in the second through hole (1421) and the cam actuator (16) goes through the second through hole (1421).

13 Claims, 5 Drawing Sheets

ELECTRICAL CONNECTOR

BACKGROUND OF THE INVENTION

1. Field of Invention

The present invention relates to an electrical connector, and more particularly to a ZIF (Zero Insertion Force) socket for use with a PGA (Pin Grid Array) chip.

2. Description of the Prior Art

A ZIF socket is often used to mount a PGA chip onto a printed circuit board (PCB). One example of the such connectors comprises a plastic base, a plastic cover mounted on the base, a plurality of electrical contacts received in the base, a metal cover plate insert molded in the cover, a bottom plate received in the base and a cam actuator for driving the cover slide along the base. The base defines a recess for receiving the bottom plate at one end thereof, and the bottom of the recess defines a through hole. The bottom plate, the cover plate and the cover plate each defines a through hole in alignment with the through hole of the base.

In assembly, the cam actuator goes through the through holes of the cover, the cover plate, the bottom plate and the base, then the cover, the cover plate, the base plate and the base can be assembled together. When cam actuator is rotated, the cover can be driven to slide along the base to make the PGA chip in contact with the contacts of the ZIF socket, then make a good electrical connection between the PGA chip and the PCB. Due to the ZIF socket becoming smaller and smaller and the number of the contacts becoming more and more, the force exerted on the cam actuator is increased. Then, the force that the bottom plate exerts on the base is accordingly increased. Because only the edge of the bottom plate engages with the base, it would be difficult to disperse the force exerted on the base, so the base is easy to be damaged.

In view of the above, a new electrical connector assembly that overcomes the above-mentioned disadvantages is desired.

SUMMARY OF THE INVENTION

Accordingly, an object of the present invention is to provide an electrical connector that can make the force exerted on the base to disperse equably.

To fulfill the above-mentioned object, an electrical connector for using with a PGA (Pin Grid Array) chip, comprises a base, a plurality of contacts received in the base, a cover slidably mounted on the base, a protecting mechanism positioned between the cover and the base, and a cam actuator rotatably assembled to the base, the cover and the protecting mechanism for actuating the cover to slid on the base. The protecting mechanism comprises a cover plate retained in the cover and a bottom plate retained in the base. The bottom plate defines a second through hole and the cam actuator extends through the second through hole of the bottom plate. The base comprises one or more block members extending upwardly and the block member is positioned in the second through hole of the bottom plate.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
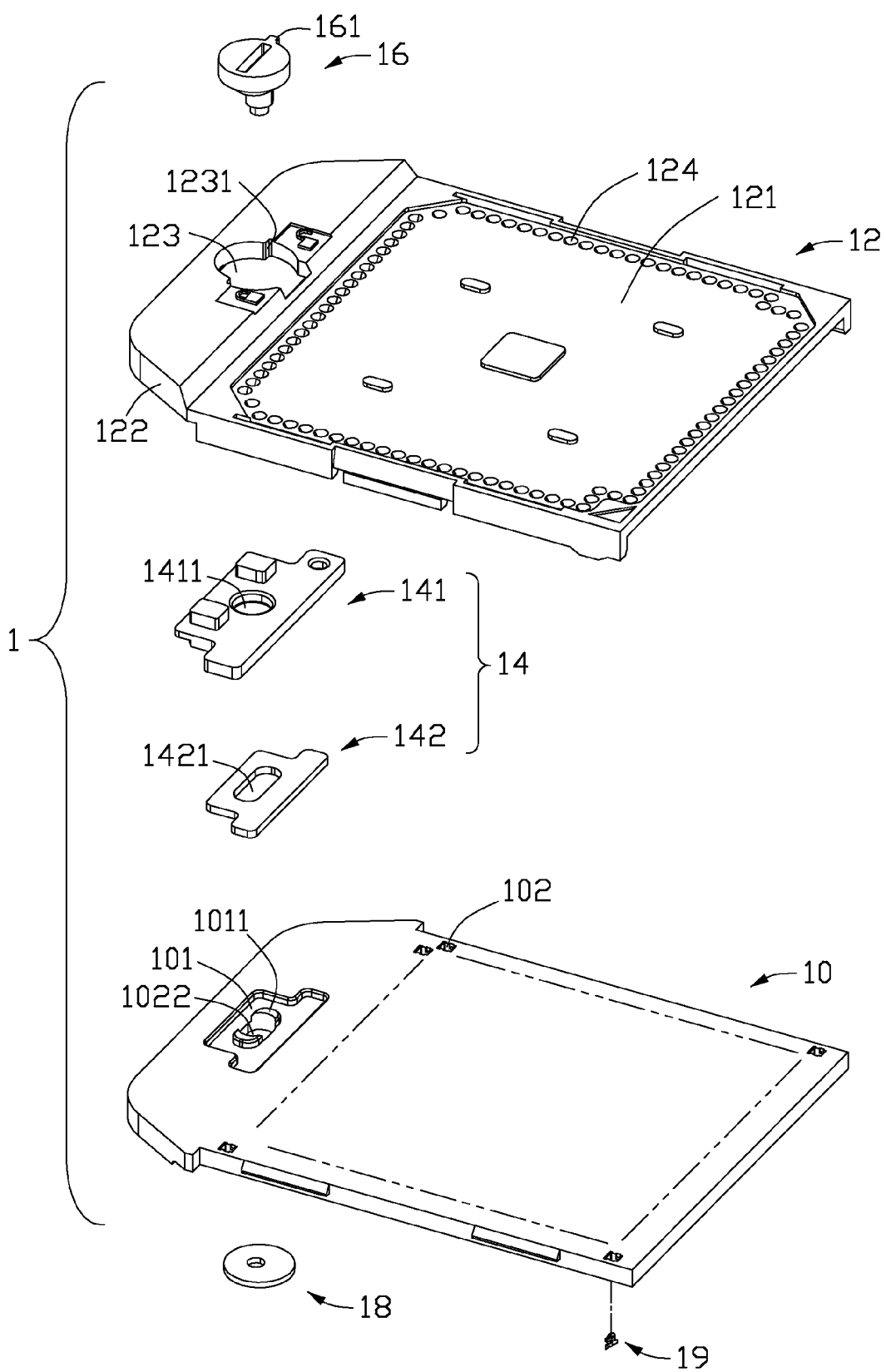
FIG. 1 is an exploded view of an electrical connector in accordance with the preferred embodiment of the present invention.
Figure 2:
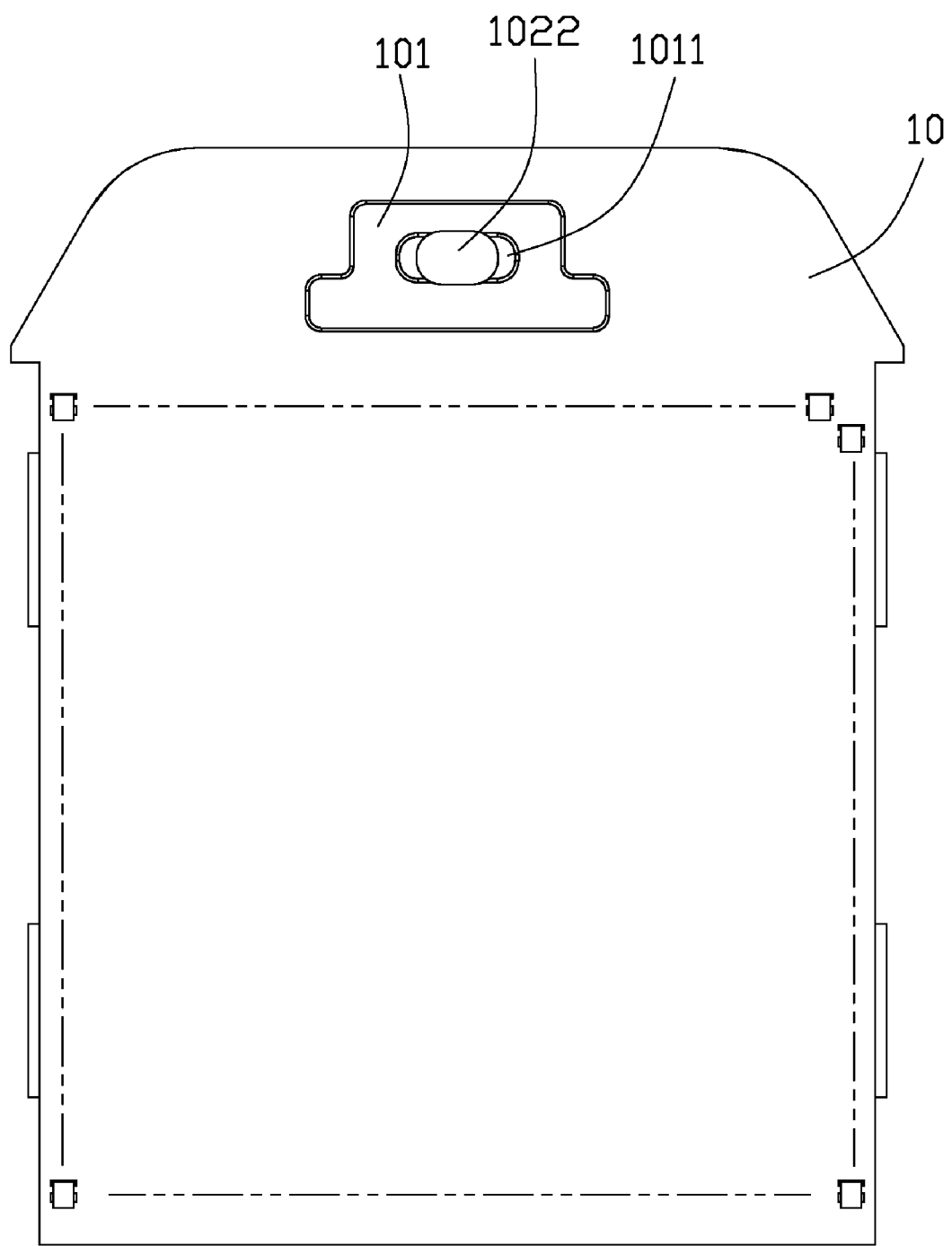
FIG. 2 is a top plane view of the base.

Referring to FIGS. 1 to 2, an electrical connector 1 in according with the present invention is used for electrically connecting an electronic package, such as a pin grid array (PGA) chip (not shown), with a circuit substrate, such as a printed circuit board (PCB) (not shown). The electrical connector 1 comprises an insulative base 10, a dielectric cover 12, a plurality of contacts 19, a metallic cam actuator 16, a protecting mechanism 14 and a washer 18.

The base 10 is generally in the shape of a square and comprises a plurality of passageways 102 extending vertically through the base 10 to receive the contacts 19 and a T-shaped recess 101 in the middle of one end. The bottom of the recess 14 defines a bottom hole 1022 and a pair of block members 1011 at the two end of the bottom hole 1022. The block members 1011 are configured to a semicircle shape.

The cover 12 has a shape corresponding to that of the base 10 and comprises a body portion 121 and a head portion 122 defined at one end of the body portion 121. The body portion 121 defines a plurality of passages 124 in alignment with the passageways 102 of the base 10. The head portion 122 defines a top hole 123 in the middle thereof. The top hole 123 consists of two semicircle-shaped holes of different diameters. A pair of opposite stop walls 1231 are provided at the junction of the two semicircle-shaped holes.

The protecting mechanism 14 comprises a T-shaped metal cover plate 141 insert molded in the cover 12 and a T-shaped metal bottom plate received in the recess 101 of the base 10. The cover plate 141 defines a first through hole 1411 in alignment with the top hole 123 of the cover 12. The bottom plate 142 defines a rectangular second through hole 1421 in alignment with the bottom hole 1022 of the base 10. The cam actuator 16 is made of several eccentric cylinders and defines a protrusion 161 extends outwardly from the top end.

Figure 3:
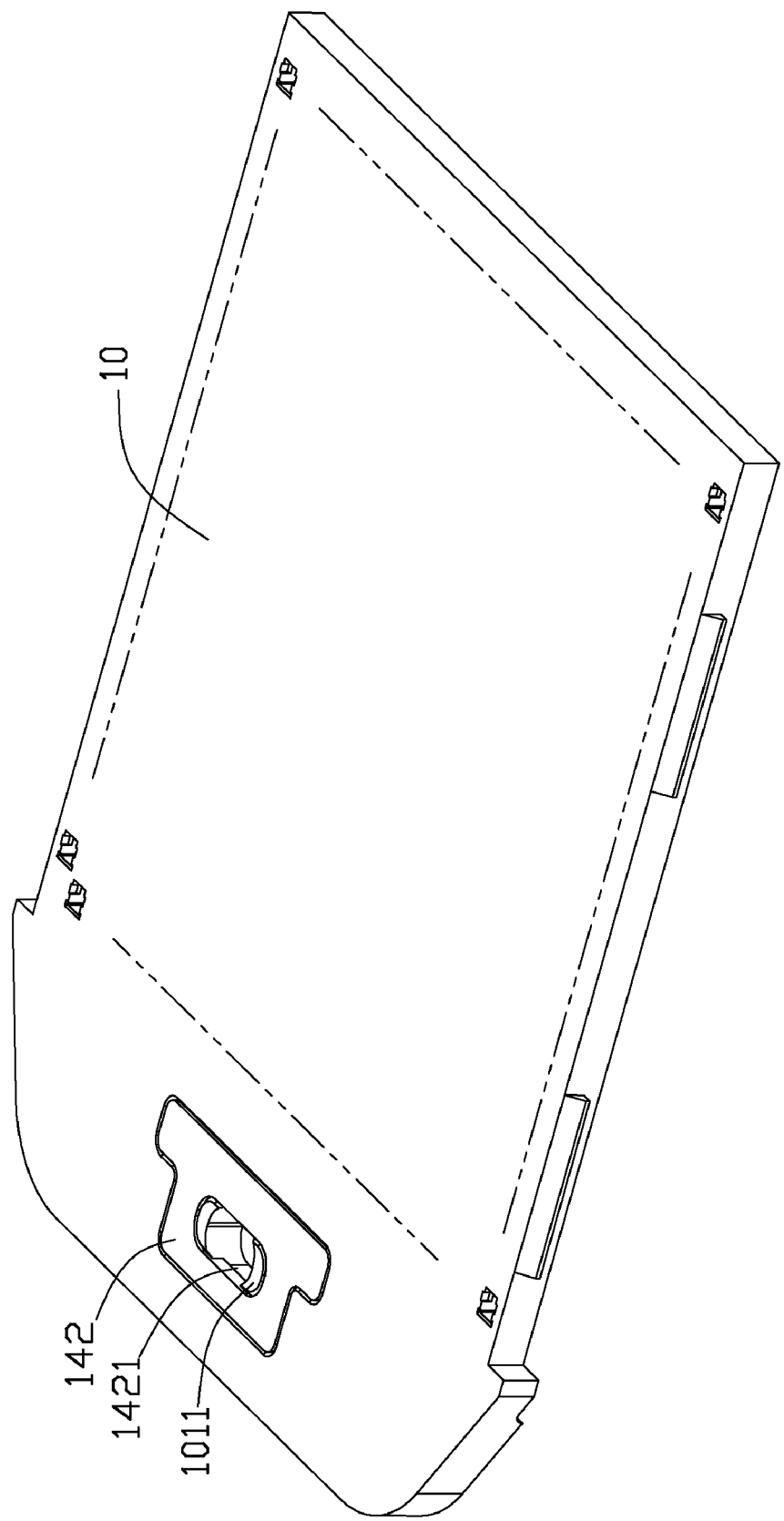
FIG. 3 is an assembled view of the bottom plate and the base, showing the block members positioned in the second through hole of the bottom plate.
Figure 4:
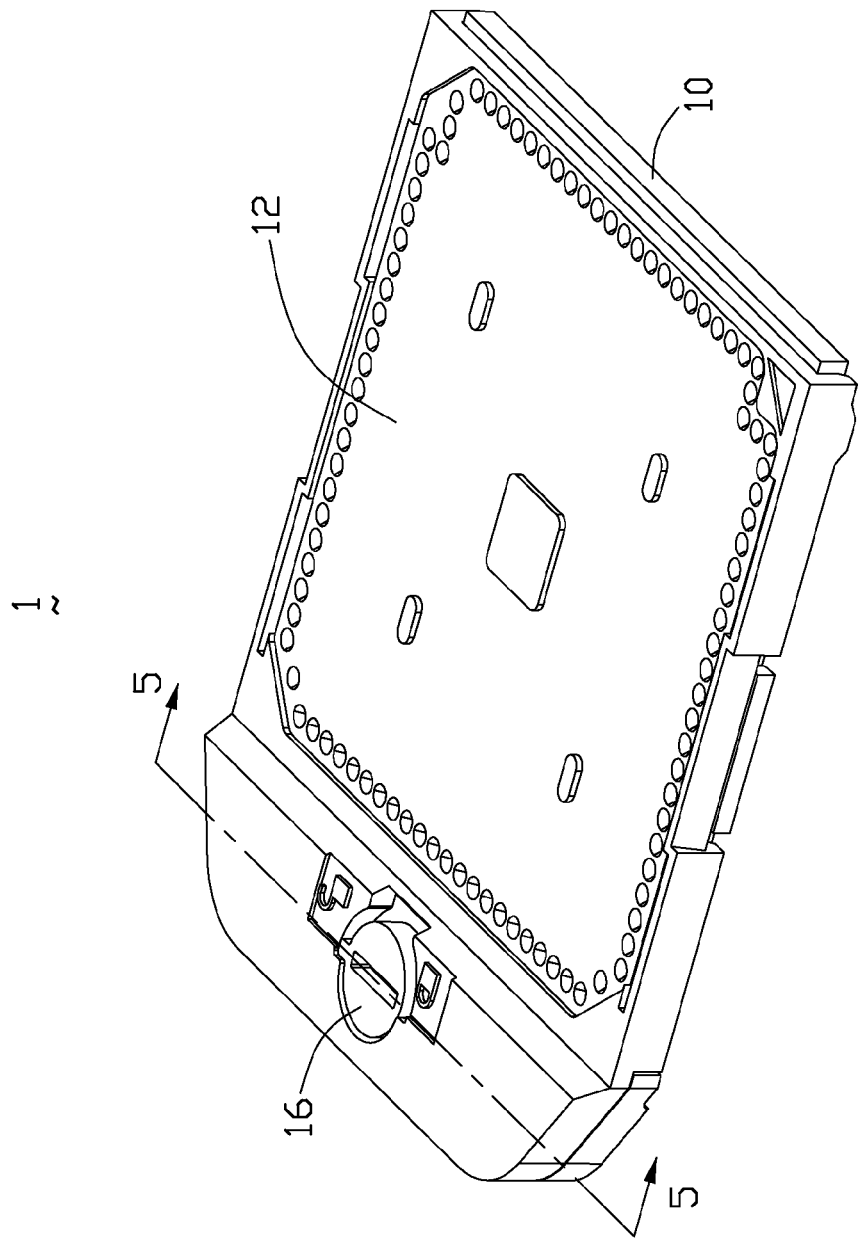
FIG. 4 is an assembled view of FIG. 1.
Figure 5:
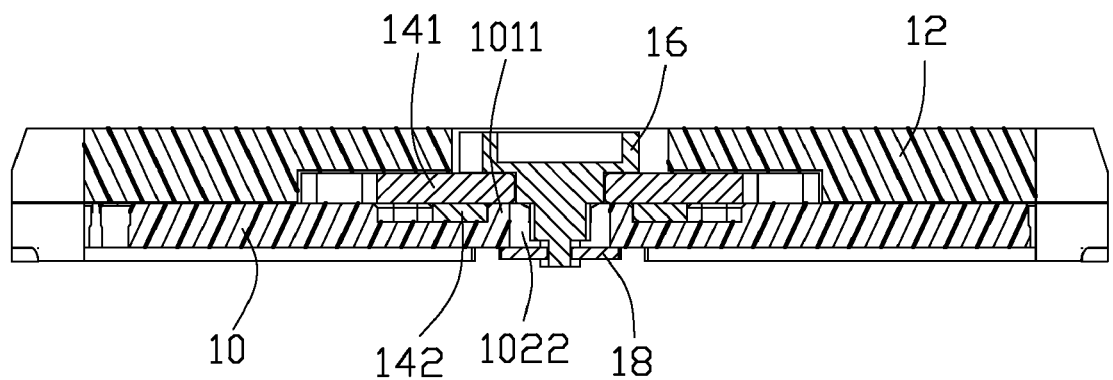
FIG. 5 is a cross-sectional view along the line 5-5, showing the cam actuator is assembled to the cover, the cover plate, the base plate and the base.

Referring to FIGS. 3 to 5, in assembly, first, the bottom plate 142 is received in the recess 101 of the base 10, the block members 1011 is positioned in the second through hole 1421 of the bottom plate 142 and the outer sidewall of the block members 1011 engaged with the bottom plate 142. Second, the cover 12 together with insert molded cover plate 141 is assembled onto the base 10. Successively, the cam actuator 16 is mounted into the electrical connector 1 from the top via the top holes 123 and then through the first through hole 1411, the second through hole 1421 and the bottom hole 1022. The end of the cam actuator 16 is riveted with the washer 18 attached on a lower surface of the base 10, whereby the cam actuator 16, the cover 12, the base 10 and the washer 18 are assembled together.

In use, rotation of the cam actuator 16 will create a driving force to move the cover 12 along the base 10, thereby making the pins (not showing) of the PGA chip engage with the contacts 19 in the passageways 102. To open dismount the electrical connector 1, the cam actuator 16 is rotated in an opposite direction, thereby can disengage the pins of the PGA chip from the contacts 19 of the electrical connector 1 and allow the PGA chip to be removed from the cover 12.

In the above detailed description, the block member 1011 engaged with the bottom plate 142 makes the force exerted on the base 10 disperse on the base 10 equably, which can prevent the damage of the base 10 due to bear a large force.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for using with a PGA (Pin Grid Array) chip, comprising:
    a base with a plurality of contacts received therein defining a recess at one end;
    a cover slidably mounted on the base;
    a protecting mechanism positioned between the cover and the base and comprising a cover plate retained in the cover and a bottom plate retained in the recess of the base, the cover plate defining a first through hole and the bottom plate defining a second through hole; and
    a cam actuator rotatably assembled to the base, the cover and the protecting mechanism for actuating the cover to slide on the base, the cam actuator extending through the second through hole of the bottom plate;
    wherein the base comprises at least one block member extending upwardly from the bottom surface of the recess, the at least one block member is positioned in the second through hole of the bottom plate and contacting with the bottom plate.

2. The electrical connector as claimed in claim 1, wherein the recess comprises a bottom hole in alignment with the second through hole of the bottom plate.

3. The electrical connector as claimed in claim 2, wherein the at least one block member is set on the end of the bottom hole.

4. The electrical connector as claimed in claim 1, wherein the outer surface of the at least one block member is engaged with the bottom plate.

5. The electrical connector as claimed in claim 1, wherein the cover plate is insert molded with the cover.

6. An electrical connector for using with a PGA (Pin Grid Array) chip, comprising:
    a base with a plurality of contacts received therein and defining a recess at one end thereof, the bottom of the recess defining a bottom hole and at least one block member at the end of the bottom hole;
    a cover slidably mounted on the base and defining a top hole in alignment of the bottom hole of the base;
    a cover plate retained in the cover and defining a first through hole;
    a bottom plate retained in the recess of the base, the bottom plate defining a second through hole and the block member positioned in the second through hole; and
    a cam actuator extending through the top hole, the second through hole and the bottom hole for actuating the cover to slide on the base.

7. The electrical connector as claimed in claim 6, wherein there are a pair of block members set on the two end of the bottom hole respectively.

8. The electrical connector as claimed in claim 6, wherein the second through hole is configured to a ellipse shape and the outer surface of the block member is engaged with the bottom plate.

9. The electrical connector as claimed in claim 6, wherein the cover plate is insert molded with the cover.

10. An electrical connector comprising:
    an insulative base;
    an insulative cover mounted upon the base and moveable relative to the base in a front-to-back direction;
    a cover plate attached on an underside of the cover;
    a bottom plate attached upon an upper side of the base;
    a first through hole defined in the cover plate;
    a second through hole defined in the bottom plate; and
    a cam actuator defining an upper section received in the first through hole, and
    a lower section received in the second through hole; wherein
    the second through hole is larger than the first through hole in a transverse direction perpendicular to said front-to-back direction, and a pair of block members unitarily extend upward from the base and into two opposite transverse ends of the second through hole under condition that said lower section of the cam actuator is communicatively moveable between said pair of block members in said transverse direction.

11. The electrical connector as claimed in claim 10, wherein said base defines a recess in an upper face thereof, and the bottom plate is received in the recess.

12. The electrical connector as claimed in claim 11, wherein the pair of block members essentially extend upward in said recess only.

13. The electrical connector as claimed in claim 12, wherein the cover defines another recess to receive said cover plate therein.

\* \* \* \* \*